United States Patent
Park et al.

(10) Patent No.: US 9,842,669 B2
(45) Date of Patent: Dec. 12, 2017

(54) STRETCHABLE WIRE AND METHOD OF FABRICATING THE SAME

(71) Applicant: ELECTRONICS AND TELECOMMUNICATIONS RESEARCH INSTITUTE, Daejeon (KR)

(72) Inventors: Chan Woo Park, Daejeon (KR); Jae Bon Koo, Daejeon (KR); Bock Soon Na, Daejeon (KR); Rae-Man Park, Daejeon (KR); Ji-Young Oh, Daejeon (KR); Sang Seok Lee, Sejong (KR); Soon-Won Jung, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 15/220,866

(22) Filed: Jul. 27, 2016

(65) Prior Publication Data

US 2017/0169918 A1    Jun. 15, 2017

(30) Foreign Application Priority Data

Dec. 10, 2015  (KR) .......................... 10-2015-0176201

(51) Int. Cl.
*H01B 7/00* (2006.01)
*H01B 7/06* (2006.01)
*H01B 13/008* (2006.01)
*H05K 1/02* (2006.01)

(52) U.S. Cl.
CPC .............. *H01B 7/06* (2013.01); *H01B 13/008* (2013.01); *H05K 1/0283* (2013.01)

(58) Field of Classification Search
CPC . H01B 7/06; H05K 1/189; H05K 1/11; H05K 1/0283; H01R 43/00
USPC ..... 174/110 R, 113 R, 117 R, 117 F, 117 FF, 174/74 R, 78, 84 R, 88, 254
See application file for complete search history.

(56) References Cited

U.S. PATENT DOCUMENTS

| | | | |
|---|---|---|---|
| 7,265,298 B2 * | 9/2007 | Maghribi | A61N 1/0551 174/254 |
| 7,629,691 B2 * | 12/2009 | Roush | H01L 23/4985 257/773 |
| 9,018,532 B2 * | 4/2015 | Wesselmann | H05K 1/0283 174/117 F |
| 9,247,648 B2 * | 1/2016 | Vanfleteren | H01L 21/565 |
| 9,516,758 B2 * | 12/2016 | Arora | H01L 23/4985 |

(Continued)

OTHER PUBLICATIONS

Ju-Hee So, et al., "Reversibly Deformable and Mechanically Tunable Fluidic Antennas", Advanced Functional Materials, vol. 19, pp. 3632-3637, Sep. 30, 2009.

(Continued)

*Primary Examiner* — William H Mayo, III
(74) *Attorney, Agent, or Firm* — Rabin & Berdo, P.C.

(57) ABSTRACT

A stretchable wire including a stretchable solid-phase conductive structure; a stretchable insulation layer which surrounds the solid-phase conductive structure; and a liquid-phase conductive material layer disposed between the solid-phase conductive structure and the stretchable insulation layer, and in contact with the solid-phase conductive structure, and a method of fabricating the same.

14 Claims, 9 Drawing Sheets

(56) References Cited

U.S. PATENT DOCUMENTS

| | | | | |
|---|---|---|---|---|
| 9,674,949 | B1* | 6/2017 | Liu | H05K 1/0283 |
| 2002/0094701 | A1* | 7/2002 | Biegelsen | B25J 13/084 |
| | | | | 439/32 |
| 2004/0238819 | A1* | 12/2004 | Maghribi | A61N 1/0551 |
| | | | | 257/57 |
| 2008/0257586 | A1* | 10/2008 | Chen | H01L 23/49816 |
| | | | | 174/254 |
| 2009/0317639 | A1* | 12/2009 | Axisa | B32B 37/185 |
| | | | | 428/411.1 |
| 2012/0051005 | A1* | 3/2012 | Vanfleteren | H01L 21/565 |
| | | | | 361/749 |
| 2014/0299362 | A1 | 10/2014 | Park et al. | |
| 2015/0173186 | A1 | 6/2015 | Na et al. | |

OTHER PUBLICATIONS

Darren S. Gray, et al., "High-Conductivity Elastomeric Electronics", Advanced Materials, vol. 16, No. 5, Mar. 5, 2004.

* cited by examiner

STRETCHABLE WIRE AND METHOD OF FABRICATING THE SAME

CROSS-REFERENCE TO RELATED APPLICATION

This U.S. non-provisional patent application claims priority under 35 U.S.C. §119 of Korean Patent Application No. 10-2015-0176201, filed on Dec. 10, 2015, the entire contents of which are hereby incorporated by reference.

BACKGROUND

The present disclosure relates to a stretchable wire and a method of fabricating the same.

Although a substrate is expanded by an external stress acting thereto, stretchable electronic devices may maintain their electrical functions without any change. Beyond limits of bendable and/or flexible elements, the stretchable electronic devices have a potential applicability to various fields such as skin sensors for robots, wearable communication devices, human body-built in/-attached bio devices, next generation displays, or the like.

The stretchable electronic devices may have a structure in which metal wires are expandable. The metal wires may be transferred on a surface of a pre-strained stretchable substrate, and then may be formed in a wavy shape as the stretchable substrate is contracted. The wavy shaped metal wires may give a stretch ability to electronic devices. However, in the stretchable electronic devices, the stretch ability of the metal wires may be limited by the amount of pre-strain initially applied to the substrate. Also, since the fabrication processes of the wavy-shaped metal wires are more complicated than the typical semiconductor device fabrication processes, the wavy-shaped metal wires have limitations such as difficulties in applying the same to a large area and securing the reliability thereof.

Other stretchable electronic devices may include a two-dimensional flat spring-shaped wire. Since the fabrication processes of the spring-shaped wire are compatible with the typical semiconductor device fabrication processes, the spring-shaped wire may save costs, easily secure the reliability, and have high electrical conductivity. However, when the spring-shaped wire is stretched, deformation is locally concentrated on a specific portion of the spring-shaped wire to cause a fracture, and thus the spring-shaped wire is limited in increasing the elongation.

SUMMARY

The present disclosure provides a stretchable wire having improved product reliability and a method of fabricating the same.

The objects of the inventive concept are not limited to the aforesaid, but other objects not described herein will be clearly understood by those skilled in the art from the description below.

An embodiment of the inventive concept provides a stretchable wire including: a stretchable solid-phase conductive structure; a stretchable insulation layer which surrounds the solid-phase conductive structure; and a liquid-phase conductive material layer disposed between the solid-phase conductive structure and the stretchable insulation layer, and in contact with the solid-phase conductive structure.

In an embodiment, the liquid-phase conductive material layer may include a liquid-phase metal layer or a liquid polymeric material layer.

In an embodiment, the liquid-phase metal layer may include an alloy containing gallium (Ga) and indium (In).

In an embodiment, the solid-phase conductive structure may have a zigzag shape or a spring shape.

In an embodiment, the stretchable insulation layer may include: a first stretchable insulation layer disposed on one surface of the solid-phase conductive structure; and a second stretchable insulation layer disposed on another surface of the solid-phase conductive structure.

In an embodiment, the stretchable insulation layer may include an elastomer.

In an embodiment, the elastomer may include Poly-Dimethylsiloxane (PDMS) or polyurethane.

In an embodiment, the solid-phase conductive structure may include a solid-phase metal or a solid-phase polymeric material.

In an embodiment of the inventive concept, a method of fabricating a stretchable wire includes: forming a liquid-phase conductive material layer by applying a liquid-phase conductive material on at least one surface of a solid-phase conductive structure which is stretchable; and forming a stretchable insulation layer on the liquid-phase conductive material layer.

In an embodiment, the method of fabricating the stretchable wire further includes: forming the solid-phase conductive structure on one surface of a substrate; forming a photoresist layer by applying a photoresist on one side of the substrate on which the solid-phase conductive structure is formed; and forming a photoresist pattern by removing a portion of the photoresist layer formed on the solid-phase conductive structure, and the forming the liquid-phase conductive material layer may include applying the liquid-phase conductive material on the solid-phase conductive structure and the photoresist pattern, after the forming the photoresist pattern.

In an embodiment, the forming the photoresist pattern may include forming sidewalls of the photoresist pattern opposed to each other based on the solid-phase conductive structure by performing a photolithography process, and the sidewalls of the photoresist pattern may form acute angles with the substrate.

In an embodiment, the shortest separation distance between the sidewalls of the photoresist pattern may be defined to be greater than a width of the solid-phase conductive structure.

In an embodiment, the method of fabricating the stretchable wire may further include removing the photoresist pattern and the liquid-phase conductive material layer applied on the photoresist pattern, and the forming the stretchable insulation layer may include forming a first stretchable insulation layer on the liquid-phase conductive material layer after removing the photoresist pattern and the liquid-phase conductive material layer applied on the photoresist pattern, separating, from the substrate, the solid-phase conductive structure and the first stretchable insulation, and forming a second stretchable insulation layer under the first stretchable insulation layer and the solid-phase conductive substrate which are separated from the substrate.

In an embodiment, the liquid-phase conductive material layer may include a liquid-phase metal layer.

Other detailed descriptions of the embodiments are included in the following descriptions and the drawings.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
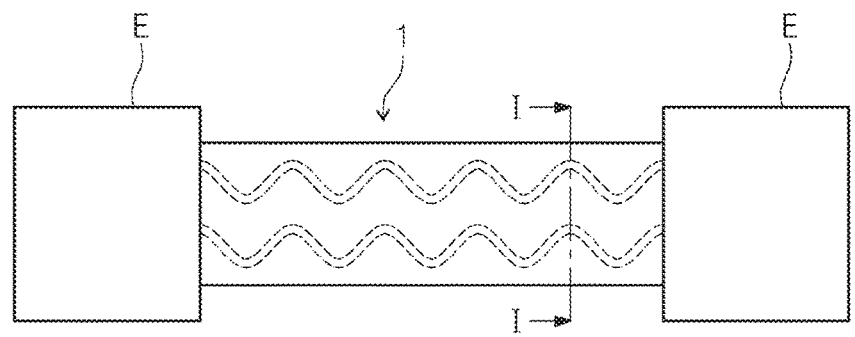
FIG. 1 is a plane view illustrating a state in which electronic devices are connected through a stretchable wire according to an embodiment of the inventive concept.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the following description, the technical terms are used only for explaining specific embodiments while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Otherwise indicated herein, all the terms used herein, which include technical or scientific terms, may have the same meaning that is generally understood by a person skilled in the art. In general, the terms defined in the dictionary should be considered to have the same meaning as the contextual meaning of the related art, and, unless clearly defined herein, should not be understood abnormally or excessively formal meaning.

Hereinafter, preferred embodiments of the present invention will be described below in more detail with reference to the accompanying drawings for explaining a stretchable wire and a method of fabricating the same.

Figure 2:
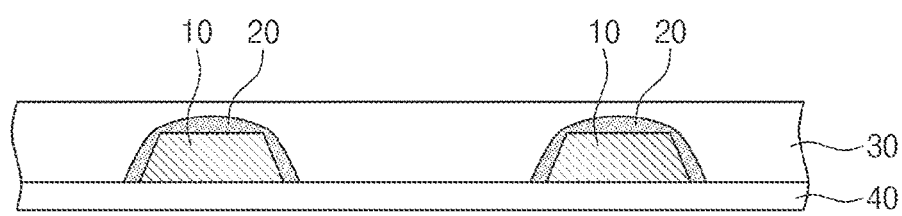
FIG. 2 is a cross-sectional view taken along line I-I of FIG. 1.

FIG. 1 is a plane view illustrating a state in which electronic devices are connected through a stretchable wire according to an embodiment of the inventive concept. FIG. 2 is a cross-sectional view taken along line I-I of FIG. 1.

Referring to FIG. 1, electronic devices E according to an embodiment of the inventive concept are electrically connected to each other by a stretchable wire 1. Thus, the electronic devices E may be connected to both ends of the stretchable wire 1. Also, as the stretchable wire 1 is stretchable in at least one direction, the stretchable wire 1 may be used in wearable communication devices, human body-built in/-attached bio devices, and the like.

Referring to FIG. 2, the stretchable wire 1 may include a solid-phase conductive structure 10, a liquid-phase conductive material layer 20, stretchable insulation layers 30 and 40.

The stretchable wire 1 may include at least one solid-phase conductive structure 10. As illustrated in FIG. 1, the stretchable wire 1 according to an embodiment of the inventive concept includes two solid-phase conductive structures 10. However, in some embodiments, the stretchable wire 1 may include one, or three or more solid-phase conductive structures 10.

The solid-phase conductive structure 10 may be stretchable. For example, the solid-phase conductive structure 10 may be stretched or contracted in at least one direction together with the stretchable insulation layer 40. In an embodiment of the inventive concept, the solid-phase conductive structure 10 may be stretched or contracted in a longitudinal direction. However, in some embodiments, the solid-phase conductive structure 10 may be stretched or contracted in all directions. Thus, the solid-phase conductive structure 10 may be freely bent.

The solid-phase conductive structure 10 maintains a solid-phase state at a temperature at which the stretchable wire 1 is used. For example, when the stretchable wire 1 is used at room temperature, the solid-phase conductive structure 10 maintains the solid-phase state at room temperature. Hereinafter, the stretchable wire 1 will be described under a given condition that the stretchable wire 1 is used at room temperature in a range from approximately 15° C. to approximately 25° C., but the temperature range is not limited thereto.

The solid-phase conductive structure 10 may include a solid-phase metal having electrical conductivity. For example, the solid-phase metal may include any one among gold (Au), silver (Ag), aluminum (Al), tungsten (W), molybdenum (Mo), nickel (Ni), and cobalt (Co). However, in some embodiments, the solid-phase conductive structure 10 may include a solid-phase polymeric material having electrical conductivity.

The solid-phase conductive structure 10 may have a zigzag shape or a spring shape. In an embodiment of the inventive concept, the solid-phase conductive structure 10 may have the zigzag shape (see FIG. 3). For example, the solid-phase conductive structure 10 may include at least one convex portions 11 and 12 (see FIG. 3) which are stretchable. Also, the plurality of convex portions 11 and 12 may be alternately and repeatedly arranged in the longitudinal direction of the solid-phase conductive structure 10, and a detailed description for the above will be given below.

The liquid-phase conductive material layer 20 may be disposed between the solid-phase conductive structure 10 and the stretchable insulation layers 30 and 40. The liquid-phase conductive material layer 20 may be in contact with at least one surface of the solid-phase conductive structure 10. As illustrated in FIG. 2, in an embodiment of the inventive concept, the liquid-phase conductive material layer 20 is in contact with an upper surface of the solid-phase conductive structure 10, but is not limited thereto.

The liquid-phase conductive material layer 20 maintains a liquid-phase state at a temperature at which the stretchable wire 1 is used. For example, when the stretchable wire 10 is used at room temperature, the liquid-phase conductive material layer 20 maintains the liquid-phase state at the room temperature.

The liquid-phase conductive material layer 20 may include a liquid-phase metal layer having electrical conductivity. For example, when the stretchable wire 1 is used at the room temperature, the liquid-phase conductive metal layer may include an alloy including gallium (Ga) and Indium (In) which maintain the liquid-phase state at the room temperature. However, in some embodiments, the liquid-phase conductive material layer 20 may include a liquid polymeric material which maintains the liquid-phase state at a temperature at which the stretchable wire 1 is used. The liquid-phase conductive material layer 20 may be made of a material different from the solid-phase conductive structure 10.

The stretchable insulation layers 30 and 40 may surround the solid-phase conductive structure 10. The stretchable insulation layers 30 and 40 may surround the liquid-phase conductive material layer 20 together with the solid-phase conductive structure 10. Thus, the stretchable insulation layers 30 and 40 may be in contact with the solid-phase conductive structure 10 and/or the liquid-phase conductive material layer 20.

The stretchable insulation layers 30 and 40 may include a stretchable elastomer. For example, the stretchable insulation layers 30 and 40 may include an elastomer containing Poly-Dimethylsiloxane (PDMS) or polyurethane. Thus, the stretchable insulation layers 30 and 40 may be stretched or contracted in at least one direction by an external force.

In an embodiment of the inventive concept, the stretchable insulation layers 30 and 40 may include a first stretchable insulation layer 30 and a second stretchable insulation layer 40. The stretchable insulation layers 30 and 40 may be formed in layers as thin as possible.

The first stretchable insulation layer 30 may be disposed on one surface of the solid-phase conductive structure 10 on which the liquid-phase conductive material layer 30 is disposed. Thus, the first stretchable insulation layer 30 may be disposed on the liquid-phase conductive material layer 20. For example, the first stretchable insulation layer 30 may be disposed on the upper surface of the solid-phase conductive structure 10, and the liquid-phase conductive material layer 20 may be in contact with the upper surface of the solid-phase conductive structure 10. Thus, the first stretchable insulation layer 30 may be disposed to cover the upper surface of the liquid-phase conductive material layer 20.

The second stretchable insulation layer 40 may be disposed on the other surface of the solid-phase conductive structure 10. For example, the second stretchable insulation layer 40 may be disposed on a lower surface of the first stretchable insulation layer 30 and the lower surface of the solid-phase conductive structure 10 on which the liquid-phase conductive material layer 20 is not disposed. Therefore, the first stretchable insulation layer 30 and the second stretchable insulation layer 40 may be formed in a sandwich shape surrounding the solid-phase conductive structure 10 on which the liquid-phase conductive material layer 20 is formed. Thus, the solid-phase conductive structure 10 and the liquid-phase conductive material layer 20 may be insulated from an external environment.

The second stretchable insulation layer 40 may be made of the same material as the first stretchable insulation layer 30. Therefore, the first stretchable insulation layer 30 and the second stretchable insulation layer 40 may be stretched and contracted to correspond to each other. As the first stretchable insulation layer 30 and the second stretchable insulation layer 40 are stretched and contracted to correspond to each other, the solid-phase conductive structure 10 may prevent occurrence of a phenomenon in which deformation is locally concentrated. Also, the stretchable wire 1 may minimize occurrence of a disconnection (open) or a crack in the solid-phase conductive structure 10 due to repeated stretching and contraction. However, in some embodiments, the second stretchable insulation layer 40 may be made of a different material from the first stretchable insulation layer 30.

The second stretchable insulation layer 40 may be formed in a layer as thin as possible. The second stretchable insulation layer 40 may have a shape corresponding to the first stretchable insulation layer 30. In an embodiment of the inventive concept, cross-sections of the first stretchable insulation layer 40 and the second stretchable insulation layer 40 may have substantially quadrangular shapes. However, in some embodiments, the cross-sections of the first and second stretchable insulation layers 30 and 40 may have various shapes such as a semi-circular shape, a triangular shape, and the like.

Also, the stretchable wire 1 may further include an adhesive layer (not illustrated) between the second stretchable insulation layer 40 and the first stretchable insulation layer 30 and/or between the second stretchable insulation layer 40 and the solid-phase conductive structure 10. The adhesive layer may improve adhesion between the second stretchable insulation layer 40 and the first stretchable insulation layer 30 and/or the adhesion between the second stretchable insulation layer 40 and the solid-phase conductive structure 10.

Figure 3:
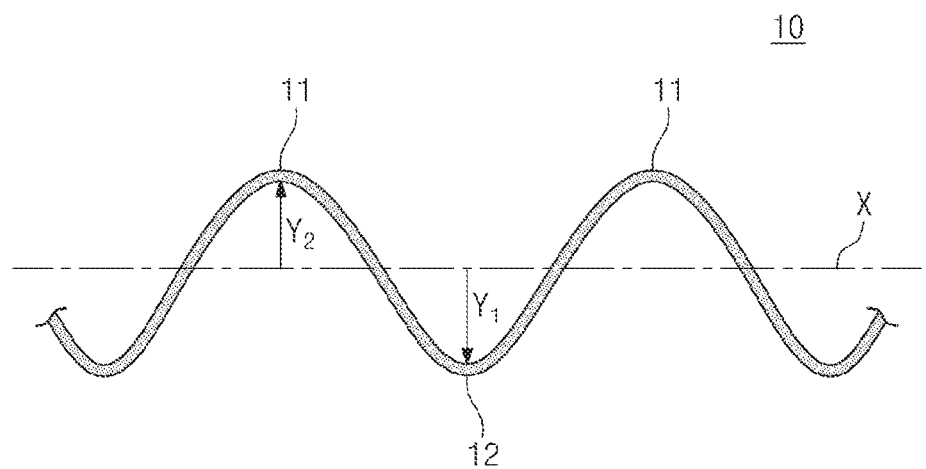
FIG. 3 is a plane view illustrating a solid-phase conductive structure of a stretchable wire according to an embodiment of the inventive concept.

FIG. 3 is a plane view illustrating a portion of a solid-phase conductive structure of the stretchable wire according to an embodiment of the inventive concept.

Referring to FIG. 3, a solid-phase conductive structure 10 according to an embodiment of the inventive concept may include at least one or more convex portions 11 and 12 which are stretchable or contractible. For example, the solid-phase conductive structure 10 may include a plurality of convex portions 11 and 12. The plurality of the convex portions 11 and 12 may include at least one first convex portion 11 and at least one second convex portion 12.

In an embodiment of the inventive concept, the first convex portion 11 may refer to a portion of the solid-phase conductive structure 10, the portion protruding in a first direction Y1 which is substantially perpendicular to a center line X passing through the middle region of the solid-phase conductive structure 10 along the longitudinal direction of the solid-phase conductive structure 10.

The plurality of the first convex portions 11 and the plurality of the second convex portions 12 may be alternately and repeatedly arranged in the longitudinal direction of the solid-phase conductive structure 10. Thus, the solid-phase conductive structure 10 may have a zigzag shape. The first convex portion 11 and the second convex portion 12 may be formed in a substantially semi-circular shape, a parabolic shape, a horseshoe shape, an ohm (Ω) shape, or the like.

Figure 4:
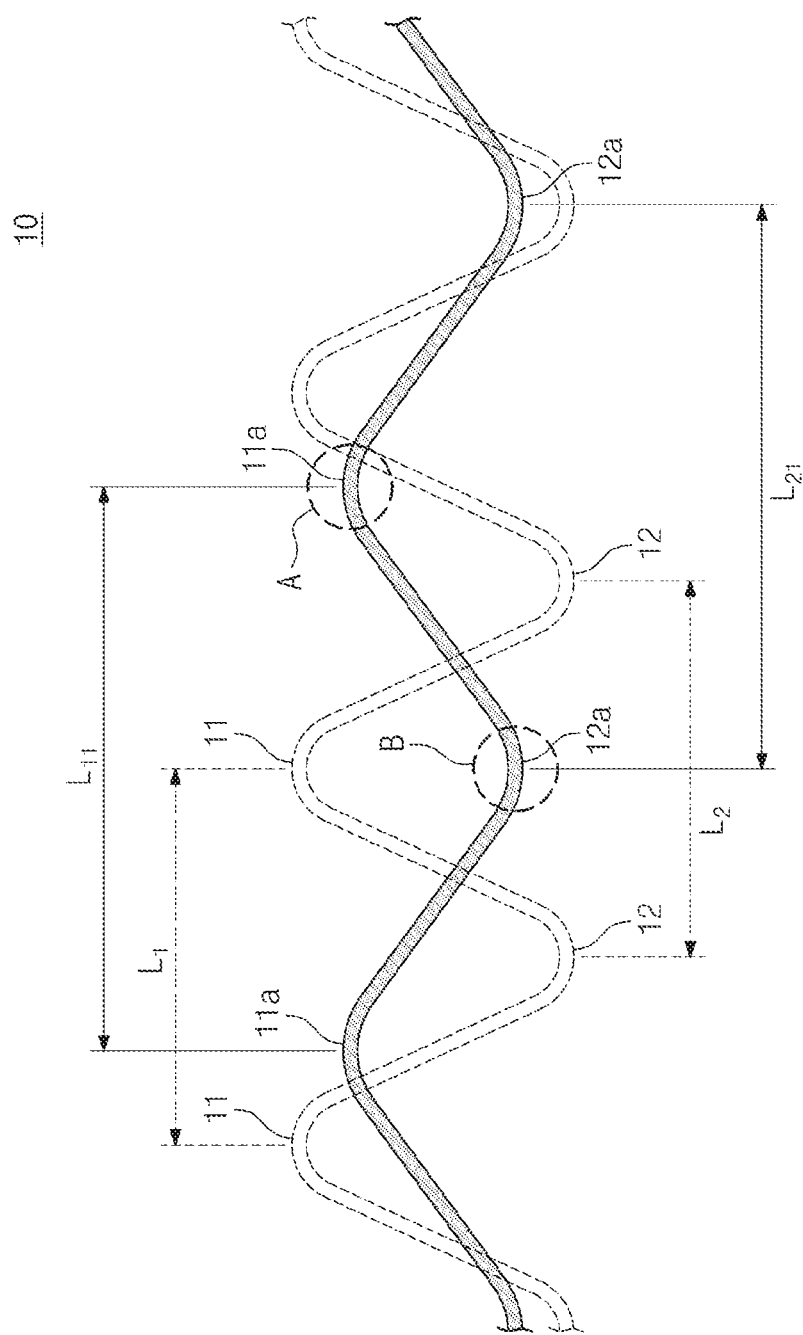
FIG. 4 is a plane view illustrating a state in which a solid-phase conductive structure of a stretchable wire according to an embodiment of the inventive concept is stretched.
Figure 5:
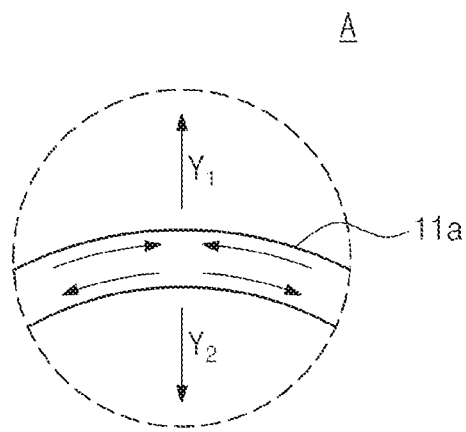
FIG. 5 is an enlarged view of section A of FIG. 4.
Figure 6:
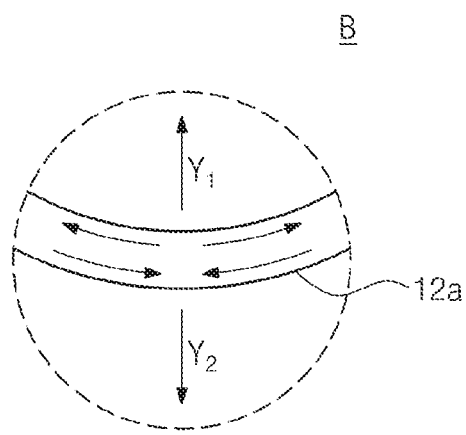
FIG. 6 is an enlarged view of section B of FIG. 4.
Figure 7:
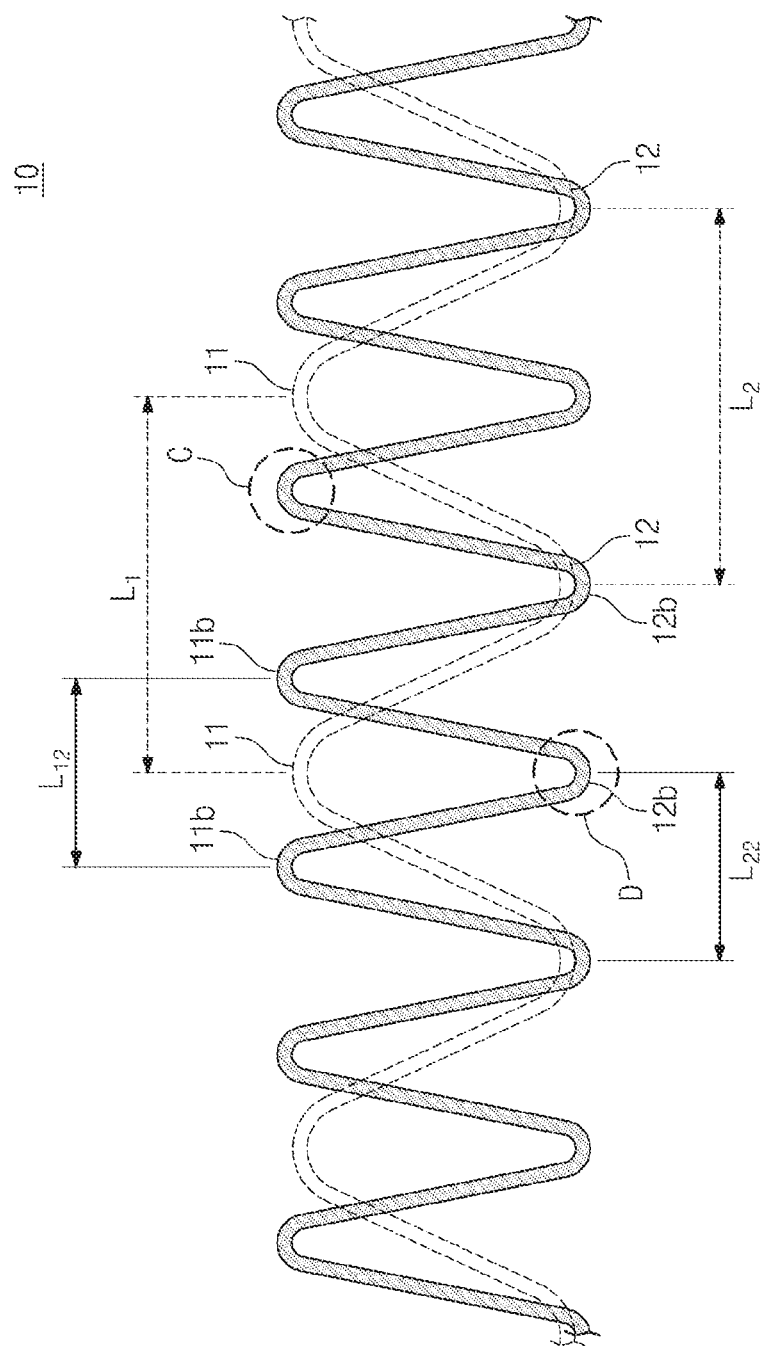
FIG. 7 is a plane view illustrating a state in which a solid-phase conductive structure according to an embodiment of the inventive concept is contracted.
Figure 8:
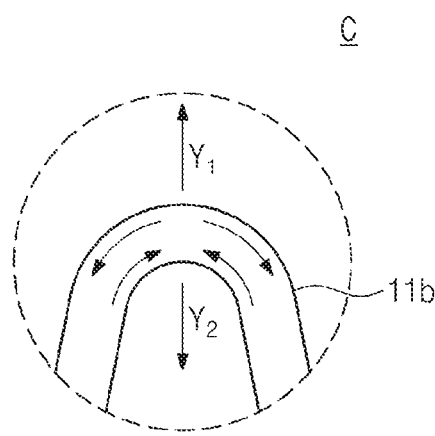
FIG. 8 is an enlarged view of section C of FIG. 7.
Figure 9:
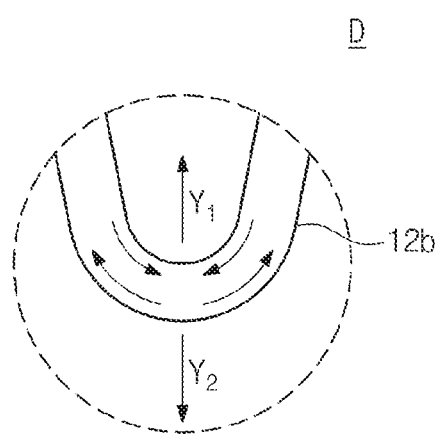
FIG. 9 is an enlarged view of section D of FIG. 7.

FIG. 4 is a plane view illustrating a state in which a solid-phase conductive structure of a stretchable wire according to an embodiment of the inventive concept is stretched. FIG. 5 is an enlarged view of section A of FIG. 4. FIG. 6 is an enlarged view of section B of FIG. 4. FIG. 7 is a plane view illustrating a state in which a solid-phase conductive structure according to an embodiment of the inventive concept is contracted. FIG. 8 is an enlarged view of section C of FIG. 7. FIG. 9 is an enlarged view of section D of FIG. 7.

In FIGS. 4 and 7, a solid-phase conductive structure 10 illustrated by dotted lines shows the solid-phase conductive structure 10 before stretched. Also, the solid-phase conductive structure 10 illustrated by solid lines in FIG. 4 shows the solid-phase conductive structure 10 as stretched. The solid-phase conductive structure 10 illustrated by solid lines in FIG. 7 shows the solid-phase conductive structure 10 as contracted.

Referring to FIG. 4, when the solid-phase conductive structure 10 is stretched, a separation distance $L_{11}$ between the plurality of the first convex portions 11a and a separation distance $L_{21}$ between the plurality of the second convex portions 12a may be increased to be greater than the separation distance $L_1$ between the plurality of the first convex portions 11 before stretched and the separation distance $L_2$ between the plurality of the second convex portions 12 before stretched.

As the solid-phase conductive structure 10 is stretched while the separation distance $L_{11}$ between the plurality of the first convex portions 11a and the separation distance $L_{21}$ between the plurality of the second convex portions 12a increase, the solid-phase conductive structure 10 may be stretched while preventing an excessive reduction of a cross-sectional area thereof. The total length of the solid-phase conductive structure 10 may also be constantly maintained. Thus, although the stretchable wire 1 (see FIG. 1) is stretched, electrical conductivity flowing in the solid-phase conductive structure 10 may be constantly maintained.

Referring to FIGS. 5 and 6, when the solid-phase conductive structure 10 is stretched, a compressive stress may act on outer sections of the plurality of the first and second convex portions 11a and 12a. When the solid-phase conductive structure 10 is stretched, a tensile stress may act on inner sections of the plurality of the first and second convex portions 11a and 12a.

Referring to FIGS. 5 and 8, the outer sections of the first convex portions 11, 11a, and 11b may refer to portions of the first convex portions 11, 11a, and 11b in a first direction Y1. Thus, the inner sections of the first convex portions 11, 11a, and 11b may refer to portions of the first convex portions 11, 11a, and 11b in a second direction Y2.

Referring to FIGS. 6 and 9, the outer sections of the second convex portions 12, 12a, and 12b may refer to portions of the second convex portions 12, 12a, and 12b in the second direction Y2. Thus, the inner sections of the second convex portions 12, 12a, and 12b may refer to portions of the second convex portions 12, 12a, and 12b in the first direction Y1.

Referring to FIG. 7, when the solid-phase conductive structure is contracted, a separation distance $L_{12}$ between the plurality of the first convex portions 11b and a separation distance $L_{22}$ between the plurality of the second convex portions 12b may be decreased to be less than a separation distance $L_1$ between the plurality of the first convex portions 11 before contracted and a separation distance $L_2$ between the plurality of the second convex portions 12 before contracted.

As the solid-phase conductive structure 10 is contracted while the separation distance $L_{12}$ between the plurality of the first convex portions 11b and the separation distance $L_{22}$ between the plurality of the second convex portions 12a decrease, the solid-phase conductive structure 10 may be contracted while preventing an excessive increase of the cross-sectional area thereof. The total length of the solid-phase conductive structure 10 may also be constantly maintained. Thus, although the stretchable wire 1 is contracted, electrical conductivity flowing in the solid-phase conductive structure 10 may be constantly maintained.

Referring to FIGS. 8 and 9, when the solid-phase conductive structure 10 is contracted, a tensile stress may act on outer sections of the plurality of the first convex portions 11b and the plurality of the second convex portions 12b. Also, when the solid-phase conductive structure 10 is contracted, a compressive stress may act on inner sections of the plurality of the first convex portions 11b and the plurality of the second convex portions 12b.

As described above, when the solid-phase conductive structure 10 is repeatedly stretched and contracted, a stress may be concentrated on the first convex portion 11 and/or the second convex portion 12. Thus, in the first convex portion 11 and/or the second convex portion 12, a fatigue fracture may occur at a lower stress than the tensile strength of the solid-phase conductive structure 10. That is, a disconnection (not illustrated) and/or a crack 13 may occur in the solid-phase conductive structure 10. When the disconnection and/or the crack 13 occur in the solid-phase conductive structure 10, characteristics of the stretchable wire 1, such as electric conductivity or the like, may be lowered or lost.

Figure 10:
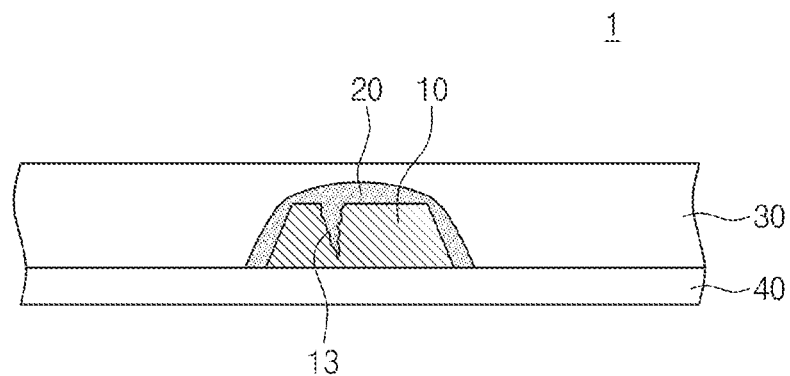
FIG. 10 is a cross-sectional view illustrating a state in which a liquid-phase conductive material layer fills up a crack occurred in a solid-phase metal structure of a stretchable wire according to an embodiment of the inventive concept.

Referring to FIG. 10, when the disconnection and/or crack 13 occur in the solid-phase conductive structure 10, a liquid-phase conductive material layer 20 formed on at least one surface of the solid-phase conductive structure 10 may fill a portion of the solid-phase conductive structure 10 where the disconnection and/or the crack 13 occur. Thus, although the disconnection and/or the crack 13 occur in the solid-phase conductive structure 10, the stretchable wire 1 may prevent the characteristics, such as the electrical conductivity or the like, from being lowered or lost.

Figure 11:
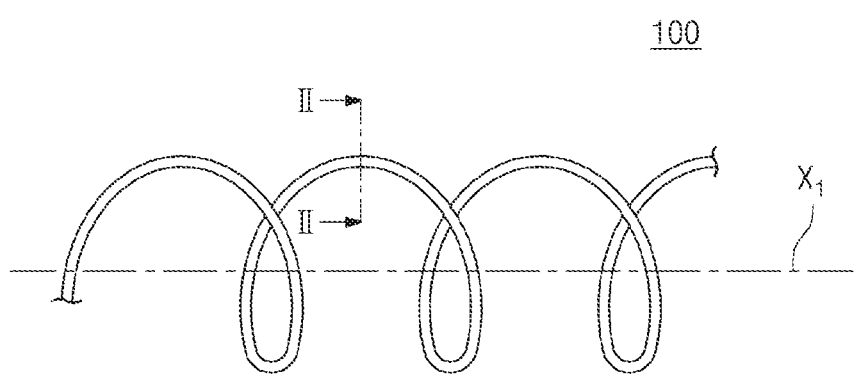
FIG. 11 is a perspective view illustrating a stretchable wire according to another embodiment of the inventive concept.
Figure 12:
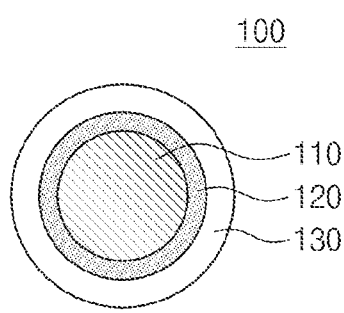
FIG. 12 is a cross-sectional view taken along line II-II of FIG. 11.

FIG. 11 is a perspective view illustrating a stretchable wire according to another embodiment of the inventive concept. FIG. 12 is a cross-sectional view taken along line II-II of FIG. 11.

For convenience of explanation, the same reference numerals will be given to the same components as those described above, and a duplicate description thereof will be omitted. Also, a stretchable wire 100 according to another embodiment of the inventive concept may be different in shape or the like from the stretchable wire 1 (see FIG. 1) according to the previous embodiment. Also, the stretchable wire 100 may not include the second stretchable insulation layer 40 (see FIG. 2).

Referring to FIG. 11, a solid-phase conductive structure 110 according to another embodiment of the inventive concept may have a spring shape. The spring shaped solid-phase conductive structure 110 may be stretched and contracted in at least one direction. For example, the spring shaped solid-phase conductive structure 110 may be stretched and contracted in a longitudinal direction X1.

Referring to FIG. 12, the cross-section of the stretchable wire 100 is formed in a substantially circular shape, but not limited thereto, and the cross-section the stretchable wire 100 may be formed in a quadrangular shape, a triangular shape, or the like.

A liquid-phase conductive material layer 120 may surround the surface of the solid-phase conductive structure 110. Also, a first stretchable insulation layer 130 may surround the surface of the liquid-phase conductive material layer 120 formed on the surface of the solid-phase conductive structure 110.

FIGS. 13 to 21 are process cross-sectional views sequentially illustrating a method of fabricating a stretchable wire according to an embodiment of the inventive concept.

Figure 13:
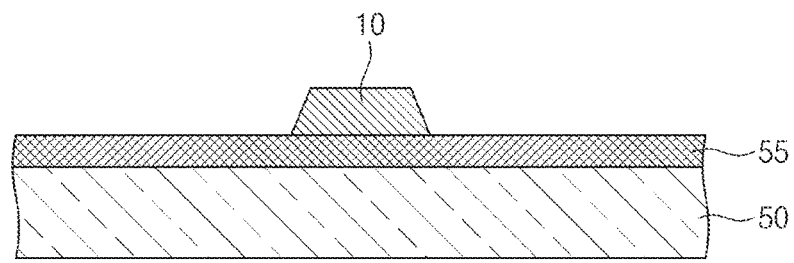
FIGS. 13 to 21 are process cross-sectional views sequentially illustrating a method of fabricating a stretchable wire according to an embodiment of the inventive concept.

Referring to FIG. 13, a stretchable solid-phase conductive structure 10 may be formed on one surface of a solid substrate 50. The solid-phase conductive structure 10 may be formed by a deposition process, a photolithography process, and an etching process.

As described above, the solid-phase conductive structure 10 may be formed in a zigzag shape, a spring shape, or the like. The solid-phase conductive structure 10 according to an embodiment of the inventive concept may include at least one convex portions 11 and 12 (see FIG. 3). As described above, in an embodiment of the inventive concept, the solid-phase conductive structure 10 may be zigzag shaped, but not limited thereto. Also, the solid-phase conductive structure 10 may include at least one of a solid-phase metal or a solid-phase polymeric material.

One surface of the substrate 50 on which the solid-phase conductive structure 10 is formed may be flat. However, in some embodiments, the one surface of the substrate 50 on which the solid-phase conductive structure 10 is formed may be curvedly formed. Thus, the solid-phase conductive structure 10 formed on the one surface of the substrate 50 may also be curvedly formed. The substrate 50 may be any one of a silicon substrate, a glass substrate, an insulation substrate, or a polymer substrate.

The substrate 50 may include a sacrificial layer 55. The sacrificial layer 55 may be formed on one side of the substrate 50. The solid-phase conductive structure 10 may be formed on the sacrificial layer 55. Thus, the sacrificial layer 55 may be disposed between the substrate 50 and the solid-phase conductive structure 10.

Also, the sacrificial layer 55 serves as a buffer layer for fabricating a stretchable wire. The sacrificial layer 55 may serve as a sacrificial film when the substrate 50 is separated from the solid-phase conductive structure 10 and the first stretchable insulation layer 30, in a subsequent process. For example, the sacrificial layer 55 may include any one among amorphous silicon, an oxide ceramic, a nitride ceramic, a polymeric material, and an oxide film which have weak adhesion. Thus, the solid-phase conductive structure 10 may be easily separated from the substrate 50.

Figure 14:
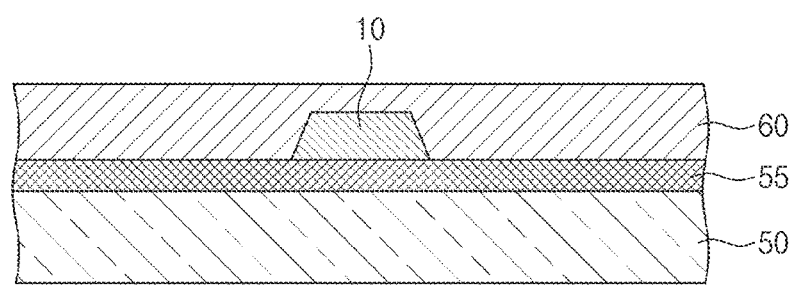

Referring to FIG. 14, a photoresist layer 60 may be formed on one surface of the substrate 50 on which the solid-phase conductive structure 10 is formed. For example, the photoresist layer 60 may be formed by applying photoresist, by a spin coating method, on the one surface of the substrate 50 on which the solid-phase conductive structure 10 is formed.

Figure 15:
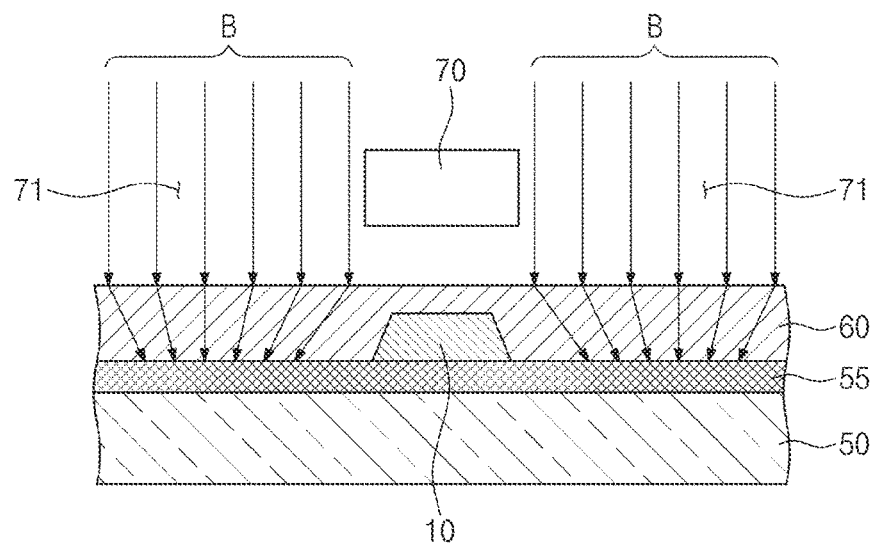
Figure 16:
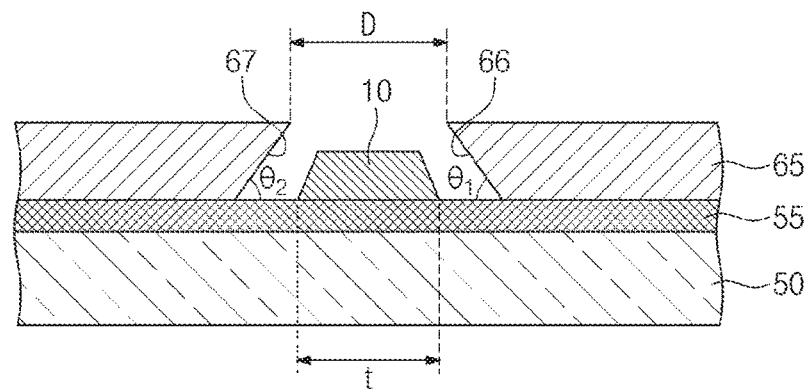
Figure 17:
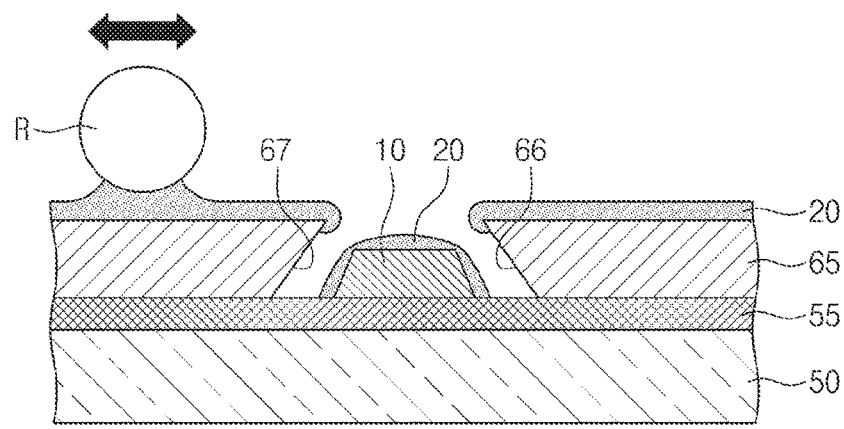

Referring to FIGS. 15 and 16, a photoresist pattern 65 may be formed by removing a portion of the photoresist layer 60 formed on the solid-phase conductive structure 10. As illustrated in FIGS. 16 and 17, the photoresist pattern 65 may include sidewalls 66 and 67.

In an embodiment of the inventive concept, the removing a portion of the photoresist layer 60 formed on the solid-phase conductive substrate may mean removing the photoresist applied on the solid-phase conductive structure 10 as well as removing the photoresist adjacent to the solid-phase conductive structure 10.

In an embodiment of the inventive concept, the photoresist pattern 65 may be formed by a photolithography process.

Referring to FIG. 15, a photo mask 70 may be disposed on the photoresist layer 60. The photo mask 70 may include a slit 71 corresponding to the solid-phase conductive structure 10 formed on the substrate 50. For example, when the solid-phase conductive structure 50 has a zigzag shape, the slit 71 of the photo mask 70 may have the zigzag shape corresponding to the solid-phase conductive structure 10. A portion of the photoresist layer 60 may be exposed to light through the slit 71 of the photo mask 70.

The photoresist may be a polymeric material in which resistance to chemicals changes when the photoresist is exposed to light. The photoresist may include a positive type which is chemical-soluble and a negative type which is chemical-insoluble, when the photoresist is exposed to light. In an embodiment of the inventive concept, the photoresist may be the negative type. Thus, a portion of the photoresist layer 60 exposed to light may remain while the remaining portion of the photoresist layer 60 not exposed to light may be removed.

When the portion of the photoresist layer 60 formed on the solid-phase conductive structure 10 is removed, the photoresist pattern 65 may include sidewalls 66 and 67 facing each other, based on the solid-phase conductive structure 10.

Also, the sidewalls 66 and 67 of the photoresist pattern 65 may form acute angles $\theta_1$ and $\theta_2$ with the substrate 50. Thus, the sidewalls 66 and 67 of the photoresist pattern 65 may include a reverse slope structure. The reverse slope structure may refer to a structure in which a separation distance between the sidewalls 66 and 67 of the photoresist pattern 65 constantly decreases as it travels away from the substrate.

Thus, a liquid-phase conductive material may not be applied on the sidewalls 66 and 67 of the photoresist pattern 65 in a subsequent process of applying the liquid-phase conductive material on the photoresist pattern 65 and the solid-phase conductive structure 10.

One example of a process in which the sidewalls 66 and 67 of the photoresist pattern 65 form the acute angles $\theta_1$ and $\theta_2$ with the substrate 50 is described. Referring to FIG. 15, light B may be incident into the photoresist layer 60 through the slit 71 of the photo mask 70. The light B incident into the photoresist layer 60 may be concentrated as it travels towards the substrate 10 from the photoresist layer 60. For example, the light B incident into the photoresist layer 60 may be refracted so that the light is condensed.

Thus, the sidewalls 66 and 67 of the photoresist pattern 65 may form the acute angles $\theta_1$ and $\theta_2$ with the substrate 50.

Also, the shortest separation distance D between the sidewalls 66 and 67 of the photoresist pattern 65 may be defined to be greater than the width t of the solid-phase conductive substrate 10. Thus, the liquid-phase conductive material may be applied on the solid-phase conductive structure 10 in the subsequent process of applying the liquid-phase conductive material on the photoresist pattern 65 and the solid-phase conductive structure 10. However, in some embodiments, the shortest separation distance D between the sidewalls 66 and 67 of the photoresist pattern 65 may be defined to be equal to the width t of the solid-phase conductive structure 10.

Also, when the shortest separation distance D between the sidewalls 66 and 67 of the photoresist pattern 65 is defined to be a little greater than the width t of the solid-phase conductive structure 10, the liquid-phase conductive material may not be substantially applied on the substrate 50.

Referring to FIG. 17, the liquid-phase conductive material may be applied on the photoresist pattern and at least one surface of the solid-phase conductive structure 10, after the photoresist pattern is formed. For example, the liquid-phase conductive material may be applied on the photoresist pattern and at least one surface of the solid-phase conductive structure 10 by a roller R. Thus, the liquid-phase conductive material may be applied on the photoresist pattern and at least the one surface of the solid-phase conductive structure 10 which is stretchable and contractible, so that a liquid-phase conductive material layer 20 may be formed.

Figure 18:
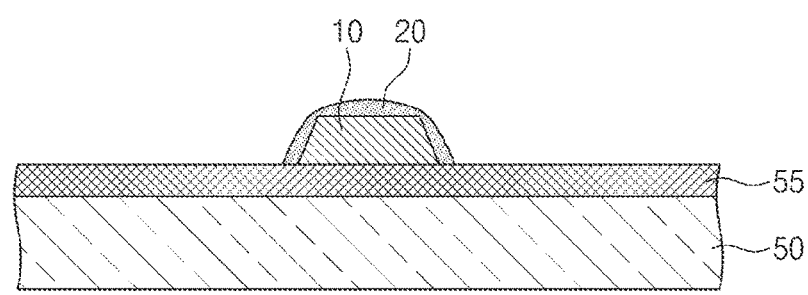

Referring to FIG. 18, the photoresist pattern 65 (see FIG. 17) and the liquid-phase conductive material layer 20 applied on the photoresist pattern 65 may be removed from the substrate 50. For example, the photoresist pattern 65 and the liquid-phase conductive material layer 20 applied on the photoresist pattern 65 may be removed from the substrate 50 by a photoresist stripper solution.

Figure 19:
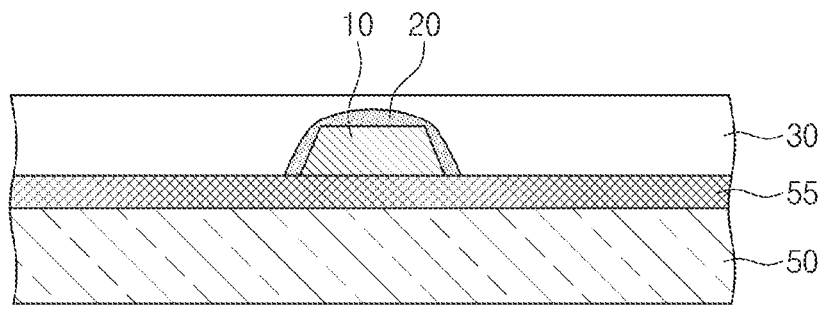

Referring to FIG. 19, a first stretchable insulation layer 30 may be formed on the liquid-phase conductive material layer 20 formed on the solid-phase conductive structure 10. For example, the first stretchable insulation layer 30 may be applied on the substrate 50 after the photoresist pattern 65 (see FIG. 17) and the liquid-phase conductive material layer 20 applied on the photoresist pattern 65 are removed. Thus, the first stretchable insulation layer 30 may be formed on the liquid-phase conductive material layer 20 formed on the solid-phase conductive structure 10 and the sacrificial layer 55 of the substrate 50. As described above, the first stretchable insulation layer 30 may include an elastomer of Poly-Dimethylsiloxane (PDMS) or polyurethane.

Figure 20:
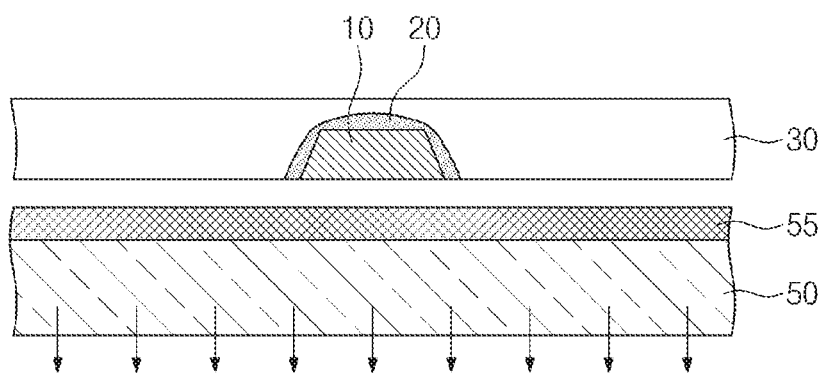

Referring to FIG. 20, the first stretchable insulation layer 30 and the solid-phase conductive structure 10 on which the liquid-phase conductive material layer 20 is applied may be separated from the substrate 50 by an external force. The first stretchable insulation layer 30 or the like may not be formed on the other surface of the solid-phase conductive structure 10 which is in contact with the substrate 50. Thus, the solid-phase conductive structure 10 may not be protected from an external environment, and may lead to occurrence of a danger such as a short circuit or the like. Thus, a second stretchable insulation layer 40 (see FIG. 21) may be formed on the other surface of the solid-phase conductive structure 10 in a subsequent process.

Figure 21:
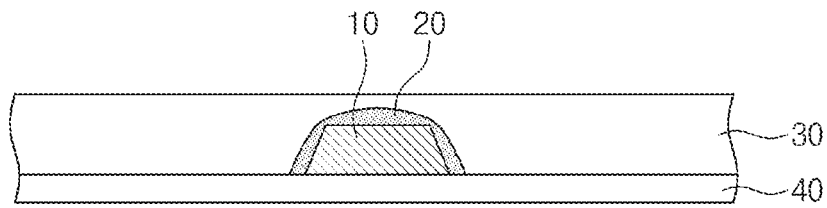

Referring to FIG. 21, a second stretchable insulation layer 40 may be formed on the other surface of the solid-phase conductive structure 10 and first stretchable insulation layer 30 separated from the substrate 50. Thus, the first stretchable insulation layer 30 and the second stretchable insulation layer 40 may be formed in a sandwich shape to surround the solid-phase conductive structure 10 on which the liquid-phase conductive material layer 20 is formed. Thus, the solid-phase conductive structure 10 and the liquid-phase conductive material layer 20 may be insulated from the external environment.

As described above, the second stretchable insulation layer 40 may include the elastomer of poly-Dimethylsiloxane (PDMS) or polyurethane.

According to a stretchable wire and a method of fabricating the same according to embodiments of the inventive concept, a liquid-phase conductive material layer is coated on a stretchable solid-phase conductive structure. Thus, when a disconnection and/or a crack occur in the solid-phase conductive structure due to repeated stretching and contraction, the liquid-phase conductive material layer may fill the disconnection and/or the crack in the solid-phase conductive structure. Thus, the stretchable wire may prevent electrical conductivity from being lowered due to the disconnection and/or the crack occurred in the solid-phase conductive structure.

Advantageous effects of the inventive concept are not limited to those set forth herein, and other advantageous effects not described herein may be clearly understood by those skilled in the art from the appended claims.

While this disclosure has been particularly shown and described with reference to preferred embodiments thereof, it will be understood by those skilled in the art that various changes in form and details may be made therein without departing from the spirit and scope of the disclosure as defined by the appended claims.

What is claimed is:

1. A stretchable wire comprising:
   a stretchable solid-phase conductive structure;
   a stretchable insulation layer which surrounds the solid-phase conductive structure; and
   a liquid-phase conductive material layer disposed between the solid-phase conductive structure and the stretchable insulation layer, and in contact with the solid-phase conductive structure.

2. The stretchable wire of claim 1, wherein the liquid-phase conductive material layer comprises a liquid-phase metal layer or a liquid polymeric material layer.

3. The stretchable wire of claim 2, wherein the liquid-phase metal layer comprises an alloy containing gallium (Ga) and Indium (In).

4. The stretchable wire of claim 1, wherein the solid-phase conductive structure has a zigzag shape or a spring shape.

5. The stretchable wire of claim 1, wherein the stretchable insulation layer comprises:
   a first stretchable insulation layer disposed on one surface of the solid-phase conductive structure; and
   a second stretchable insulation layer disposed on another surface of the solid-phase conductive structure.

6. The stretchable wire of claim 1, wherein the stretchable insulation layer comprises an elastomer.

7. The stretchable wire of claim 6, wherein the elastomer comprises Poly-Dimethylsiloxane (PDMS) or polyurethane.

8. The stretchable wire of claim 1, wherein the solid-phase conductive structure comprises a solid-phase metal or a solid-phase polymeric material.

9. A method of fabricating a stretchable wire, the method comprising:
   forming a liquid-phase conductive material layer by applying a liquid-phase conductive material on at least one surface of a solid-phase conductive structure which is stretchable; and
   forming a stretchable insulation layer on the liquid-phase conductive material layer.

10. The method of claim 9, further comprising:
    forming the solid-phase conductive structure on one surface of a substrate;
    forming a photoresist layer by applying a photoresist on one side of the substrate on which the solid-phase conductive structure is formed; and
    forming a photoresist pattern by removing a portion of the photoresist layer formed on the solid-phase conductive structure,
    wherein the forming the liquid-phase conductive material layer comprises applying the liquid-phase conductive material on the solid-phase conductive structure and the photoresist pattern, after the forming the photoresist pattern.

11. The method of claim 10, wherein the forming the photoresist pattern comprises forming sidewalls of the photoresist pattern opposed to each other based on the solid-phase conductive structure by performing a photolithography process, wherein the sidewalls of the photoresist pattern form acute angles with the substrate.

12. The method of claim 11, wherein the shortest separation distance between the sidewalls of the photoresist pattern is defined to be greater than a width of the solid-phase conductive structure.

13. The method of claim 10, further comprising removing the photoresist pattern and the liquid-phase conductive material layer applied on the photoresist pattern,
wherein the forming the stretchable insulation layer comprises:
forming a first stretchable insulation layer on the liquid-phase conductive material layer after removing the photoresist pattern and the liquid-phase conductive material layer applied on the photoresist pattern;
separating, from the substrate, the solid-phase conductive structure and the first stretchable insulation; and
forming a second stretchable insulation layer under the first stretchable insulation layer and the solid-phase conductive substrate which are separated from the substrate.

14. The method of claim 9, wherein the liquid-phase conductive material layer comprises a liquid-phase metal layer.

* * * * *